(12) United States Patent
Suomi et al.

(10) Patent No.: US 11,250,179 B2
(45) Date of Patent: Feb. 15, 2022

(54) ENGINEERING DRAWINGS AND DIGITAL TWINS

(71) Applicant: Trimble Solutions Corporation, Espoo (FI)

(72) Inventors: Jukka Suomi, Espoo (FI); Oxana Kyllönen, Espoo (FI); Mikko Huovila, Espoo (FI); Charles Pool, Espoo (FI); Ville Rousu, Espoo (FI); Henri Pitkänen, Espoo (FI); Tommi Martela, Espoo (FI)

(73) Assignee: Trimble Solutions Corporation, Espoo (FI)

( * ) Notice: Subject to any disclaimer, the term of this patent is extended or adjusted under 35 U.S.C. 154(b) by 192 days.

(21) Appl. No.: 16/668,425

(22) Filed: Oct. 30, 2019

(65) Prior Publication Data
US 2020/0134106 A1    Apr. 30, 2020

(30) Foreign Application Priority Data
Oct. 31, 2018  (FI) ..................................... 20185922

(51) Int. Cl.
| | |
|---|---|
| *G06F 17/10* | (2006.01) |
| *G06F 30/13* | (2020.01) |
| *G06T 11/60* | (2006.01) |
| *G06T 11/20* | (2006.01) |
| *G06F 30/20* | (2020.01) |

(52) U.S. Cl.
CPC ............. *G06F 30/13* (2020.01); *G06F 30/20* (2020.01); *G06T 11/203* (2013.01); *G06T 11/60* (2013.01)

(58) Field of Classification Search
CPC .......... G06F 30/13; G06F 30/20; G06T 11/60; G06T 11/203

USPC ............................................................. 703/1
See application file for complete search history.

(56) References Cited

U.S. PATENT DOCUMENTS

| | | | |
|---|---|---|---|
| 2001/0018644 A1 | 8/2001 | Schwalb et al. | |
| 2006/0044307 A1* | 3/2006 | Song ................. | G06Q 10/06398 345/419 |
| 2007/0179976 A1* | 8/2007 | Arvin ...................... | G06F 30/00 |

FOREIGN PATENT DOCUMENTS

| | | |
|---|---|---|
| EP | 3 499 390 A1 | 6/2019 |
| WO | 2018/030073 A1 | 2/2018 |

OTHER PUBLICATIONS

Finnish Patent and Registration Office Search Report for Application No. 20185922, dated Feb. 28, 2019, 1 page.
Ebert, P., "Port of Portland CAD & BIM Standards Manual," 2015, 106 pages.

* cited by examiner

*Primary Examiner* — Andre Pierre Louis
(74) *Attorney, Agent, or Firm* — Kilpatrick Townsend & Stockton LLP

(57) ABSTRACT

To enable to display one or more drawing content, which have been created during defining one or more engineering drawings from a model which comprises one or more parts to model one or more structures, digital twins of the one or more drawing content with associated information are created and published. The associated information of the digital twin comprises three-dimensional coordinates for the drawing content in question, determined based on one or more parts, to which the drawing content relates, and identifying information of said one or more parts.

20 Claims, 7 Drawing Sheets

ENGINEERING DRAWINGS AND DIGITAL TWINS

RELATED APPLICATIONS

This application claims priority to Finnish patent application no. 20185922, filed on Oct. 31, 2018, the contents of which is hereby incorporated herein by reference in its entirety.

FIELD

The present invention relates generally to computer aided modeling of structures, and especially drawing contents created for engineering drawings.

BACKGROUND

The development of data processing systems, computer and computer applications has transformed different processes into computerized processes. For example, engineering drawings are created and manipulated by computer applications.

The purpose of an engineering drawing is to capture the engineering design accurately and unambiguously. The end goal of such an engineering drawing is to convey all the required information that will allow a manufacturer to produce the engineering design. Typically engineering drawings include at least geometry, i.e. the shape, and related information. Examples of related information include dimensions defining the size in accepted units, tolerances determining allowable variations for each dimension, material information describing what the design/part(s) of the design will be made of, and/or information specifying the surface quality. Thus, the amount of information in a single engineering drawing may be huge. Therefore, the engineering drawing is rather difficult to read and reading is prone to errors. That contradicts the purpose of an engineering drawing, the purpose being to convey information very precisely, with very little ambiguity.

SUMMARY

The invention relates to a method, a program product, an apparatus and a system which are characterized by what is stated in the independent claims. The preferred embodiments are disclosed in the dependent claims.

A general aspect introduces a solution that enables to display one or more drawing content, which have been created during defining one or more engineering drawings from a model, on top of the model view displayed.

BRIEF DESCRIPTION OF THE DRAWINGS

In the following different embodiments of the invention will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any computer-aided modeling system, and corresponding modeling applications (i.e. modeling programs), or any other system/applications configured or configurable to create and/or to manipulate engineering drawings from models created by the same or compatible computer-aided modeling application, and/or configured or configurable to display at least different views of the model. Examples of such applications are computer aided design applications and computer aided modeling applications, such as different Building Information Modeling (BIM) applications. Current BIM applications are used to plan, design, construct, operate and maintain diverse physical structures (infrastructures), such as different buildings, roads, bridges, ports, tunnels, etc.

Various programming techniques, storage of data in memory and manners of modeling real world articles and implementing databases develop constantly. This may require extra changes in the invention. Consequently, all terms and expressions should be interpreted broadly, and they are intended to describe, not to restrict, the invention.

Figure 1:
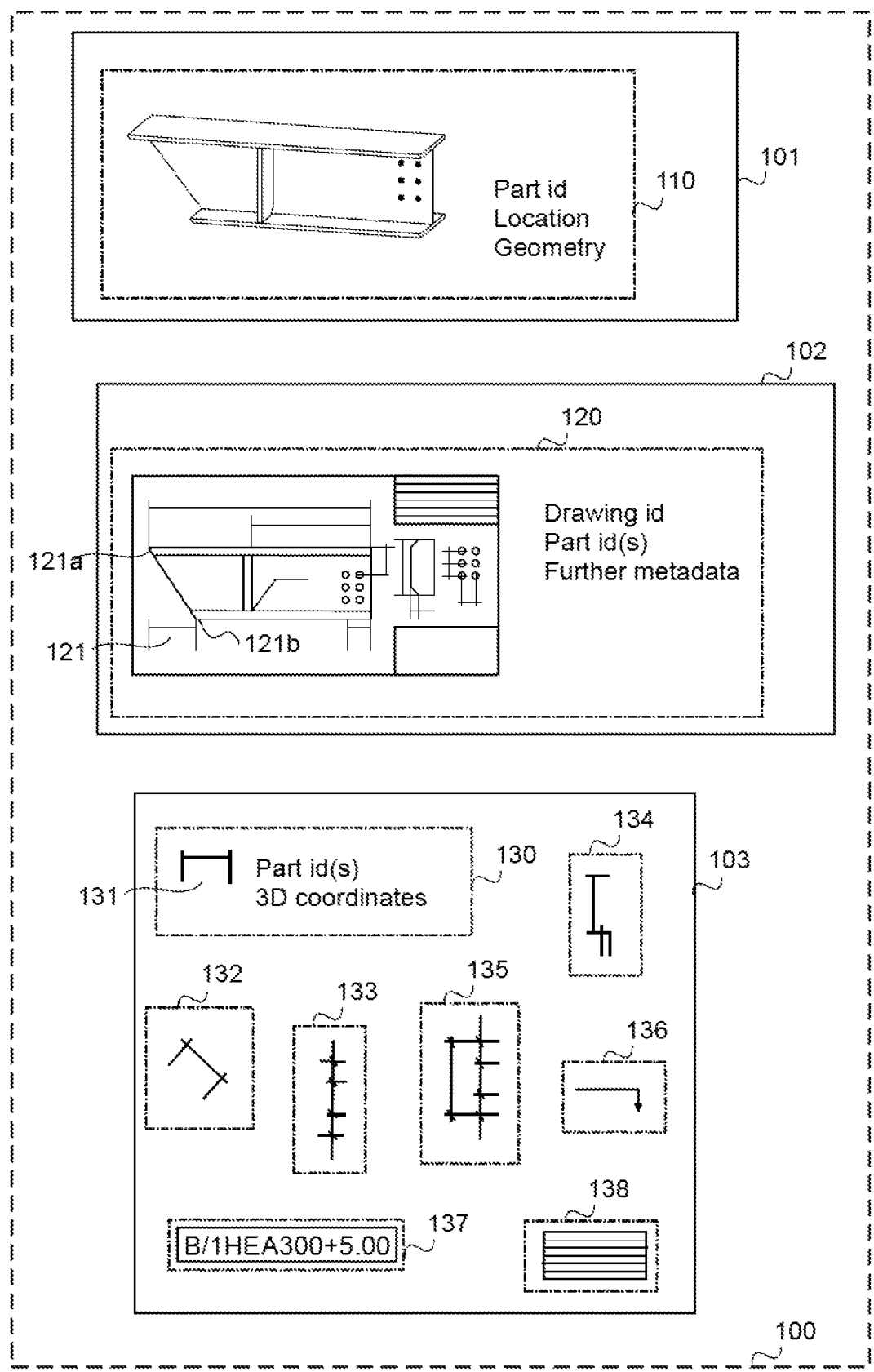
FIG. 1 is a schematic diagram depicting a basic concept.

FIG. 1 is a schematic diagram depicting a basic concept of a digital model on a generalized level.

Referring to FIG. 1, a digital model 100 of a structure comprises model data 101, drawing data 102 and drawing content data 103.

The model data 101 of a structure comprises one or more objects that represent real-world articles forming the modelled structure. It should be appreciated that herein "article" means an item that will or may exist in the real world or at least is planned to exist in the real world. Further, it should be appreciated that the term "article" used herein means, in addition to one or more single pieces/items/elements, one or more parts, one or more assemblies including sub-assemblies, one or more structures forming a further structure, and/or one or more connections with their articles, like bolt(s), weld(s) or reinforcement splices(s).

In three-dimension models, i.e. 3D models, an article is modeled as a 3D object 110. The definitions of an object defines at least geometrical properties of the object and its location in the model (location in 3D coordination system which is a global coordination system within the model). Typically an object is given its creation point or points, the amount of creation points depending on the article to be modeled and the modeling application used, and values for different parameters representing the physical values of the article. Examples of creation points include a starting point and an ending point of the object, or creation points defining outlines of the objects. A plurality of properties can be associated with each object that can detail, in addition to the location and geometry of the object, the manner of connectivity of the object to other objects, materials used to, or to be used to, realize the object, such as concrete, wood, steel, and other suitable properties. Further, usually each object has an identifier, which is part of the object's model data. A non-limiting example of such an identifier is a globally unique identifier (GUID). The identifier, or part of it, may be automatically created by the modeling application, or obtained as user input.

It should be appreciated that it bears no significance to the invention, how objects and related information are created, as long as they can be identified, and their geometry and location(s) in the model are retrievable (obtainable) by an application to create and/or manipulate engineering drawings, and an application configured to display 3D models.

Below term "part" is used as a synonym to an object representing an article.

The drawing data 102 comprises drawing definitions for one or more engineering drawings 120. Engineering drawings 120 communicate the requirements for the manufacture, including maintenance and repairing, of an end-product (structure), an assembly of end-products and different installations in the end-product. In other words, engineering drawings are used to fully and clearly define requirements for engineered items. Such engineering drawings are often used to aid in the creation, simulation, planning, construction, maintenance, manufacturing, or other aspect of technical interaction with structure. Engineering drawings are sometimes called technical drawings. Engineering drawings are usually created in accordance with standardized conventions for layout, nomenclature, interpretation, appearance, size, etc. Each field of engineering has its own requirements for engineering drawings. Almost all engineering drawings convey not only geometry (shape and location) but also dimensions and tolerances for those characteristics. In building industry, the engineering drawings are extremely important: data flow is based on engineering drawings; liabilities are based on engineering drawings; building permits include engineering drawings the building permits are based on; a building permit cannot be received without engineering drawings; and drawings used in site to build the building are also engineering drawings, or based on engineering drawings. An engineering drawing has a status. The status may be officially approved, or any of statuses, such as a draft, workshop drawing (working drawing), updated after official approval, the update not yet officially approved, under a "status umbrella" "not officially approved". An engineering drawing, especially with the status of officially approved, is a legal document (a legal instrument), because it communicates all the needed information about "what is wanted" to builders (manufacturers). It is thus a part of a contract. If the result is a wrong one, the builders are protected from liability as long as they have faithfully executed the instructions conveyed by the officially approved engineering drawings.

An engineering drawing 120 comprises reference(s), like part identifiers, to those parts in the model data that are at least partly included in the engineering drawing, and one or more views created based on geometrical dimensions of the part(s), and so called drawing objects defining drawing contents. The views and the drawing objects define how and with which information the selected parts are outputted in the engineering drawing. A non-limiting list of examples of information that drawing objects define includes identifying information on a construction, information about properties of parts, information about an assembly to a workshop, information which parts should be connected to each other, information about how parts should be connected to each other, dimensions 121 of a part (or component), and an annotation from an engineer indicating that a specific material should be used to produce the part (or component). A dimension 121 may be created by defining corresponding reference points 121a, 121b, and orientation information of the dimension line (vertical, horizontal, aligned, etc.). More precisely, a dimension definitions define a dimension value, or information, based on which the modeling application calculates the dimension value, layout information including orientation vector of a dimension line, layout type (base, queue, etc.), one or two reference points, and identification information of one or more parts. A drawing object might also include audio, video, or image files that portray or provide additional information to the drawing. A drawing object may be graphics, like 2D graphics representing a predefined standard detail, or a predefined view. Still a further example of a drawing object include a report, such as a table listing what the drawing contains, and a list of materials. When a drawing is opened, and if a drawing object, for example a dimension text, depends on the part's corresponding dimension, the value of the dimension is obtained, by means of the reference to the part, from the model data 101, and therefore it will always be up-to-date. It should be appreciated that there may be dimensions defined as drawing objects without any reference to the model data.

Further, usually each drawing has an identifier, such as the globally unique identifier, and each drawing object may be associated with an identifier, such as the globally unique identifier. The identifier(s), or part of an identifier, may be automatically created by the modeling application.

It should be appreciated that it bears no significance to the invention, how drawing definitions are created and/or manipulated.

Herein a term "drawing content" is used in a meaning of a drawing object, i.e. additional information provided in a drawing and created when an engineering drawing is created or manipulated. As is evident from the examples above, the additional information may be a view, a dimension with corresponding text (or a collection of dimensions), or an annotation, the annotation being a critical or explanatory note or body of notes added to a drawing.

The drawing content data 103 is a new component to the digital model 100, and examples how to create the drawing content data, or how to use it will be described in more detail below. The drawing content data comprises at least drawing content objects 130, 131, 132, 133, 134, 135, 136, 137, 138. A drawing content object 130 comprises at least a digital twin (copy, mirrored data, replica) 131 of a drawing content 121 created in a drawing, its 3D coordinates in the model coordinate system (i.e. global coordinate system within the model), references to one or more parts it relates to, i.e. one or more part identifiers. The drawing content object may comprise also other information, as will be explained below. For example, the drawing content object may be linked to the drawing by having a drawing identifier, and/or the drawing content identifier.

In the example illustrated in FIG. 1, the drawing content data 103 contains examples of digital twins. The examples do not include all digital twins of drawing 120 but include also digital twins from other drawings than the one illustrated in drawing 120, to highlight versatility of types of the digital twins. The illustrated examples of dimensions (without numeric values) include single dimensions 130, 132, a multi dimension 133, dimension groups 134, 135 with different level of groupings and an elevation mark 136. The digital twins contain the definitions of the corresponding dimension in the drawing, preferably including identifier of the dimension in the drawing, facilitating updating the digital twin in case the original dimension changes. Further examples of digital twins illustrated in FIG. 1 in the drawing content data 103 are an annotation 137 and a table 138 (without text), just to illustrate a wide variety of what a drawing content may be. (The table 138 is a kind of an annotation.)

According to the basic concept, a part 110 is always created in a model, i.e. its definitions are in the model data 101, but the part may also be represented as a view in an engineering drawing and, by means of a reference, as a piece of one or more drawing contents 121 in the drawing data 102. A drawing content is always created in a drawing during a drawing creation or updating process, and its digital twin 131 with model mapping information is published (stored, uploaded) as a separate piece to the drawing content data.

Figure 2:
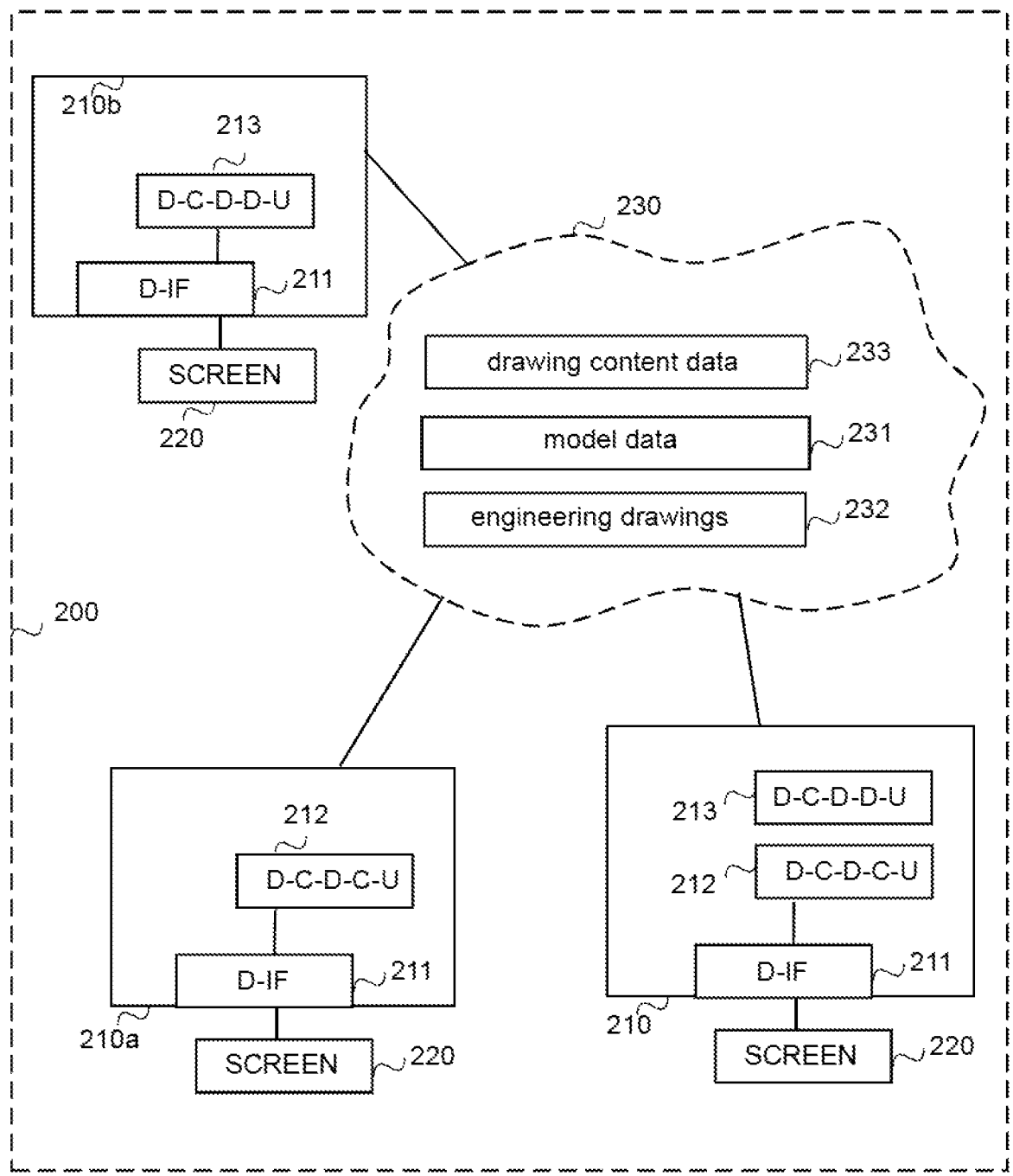
FIG. 2 shows a simplified architecture of an example of a system and a schematic block diagrams of some apparatuses.

FIG. 2 illustrates a simplified system describing only some logical units with their operative connections, the implementation of which may deviate from what is presented. It is obvious to a person skilled in the art that the system may also comprise other functions and structures that need not be described in greater detail here. The more detailed structure of the system is irrelevant to the actual invention.

The modeling system 200 illustrated in FIG. 2 is a simplified modeling system that comprises one or more apparatuses 210, 210a, 210b (three are shown in FIG. 2) that are connectable to one or more data storages 230.

The apparatus 210, 210a, 210b may be any computing device that can be configured to perform at least part of functionalities described below relating to drawing contents. For that purpose the apparatus 210, 210a, 210b comprises one or more user interfaces 211, and either a drawing content data creation unit (D-C-D-C-U) 212 or a model and drawing content data display unit (D-C-D-D-U) 213, or both of the units. The apparatus 210, 210a, 210b can be further configured to create and/or modify and/or edit and/or change and/or view and/or output models and/or engineering drawings, or corresponding one or more models. A user interface 211 is the interface of a user to the modeling system. The user may, depending on the capabilities and application in use, create a model, modify a model, study it, output desired drawings, such as the engineering drawings, and/or reports of the model, view the model, input information, including different selections, relating to the drawing content, etc. by using the one or more user interfaces 211. For example, one of the interfaces 211 may be a display interface (D-IF) via which models and/or engineering drawings may be shown on a display screen 220. A non-limiting list of examples of apparatuses 210, 210a, 210b includes a user terminal or a work station, such as a laptop, a smartphone, a personal computer, a tablet computer, a field device, a virtual reality device, augmented reality (AR) interface device, a web client, or a server, like a cloud server or a grid server.

The data storage 230 stores model data 231, engineering drawings 232 (drawing data) and drawing content data 233, that are explained above. The data is preferably stored in the data storage 230 as a shared data. The data storage 230 may be any kind of conventional or future data repository, including distributed and centralized storing of data, managed by any suitable management system forming part of the modeling system (modeling environment). An example of distributed storing includes a cloud-based storage in a cloud environment (which may be a public cloud, a community cloud, a private cloud, or a hybrid cloud, for example). Cloud storage services may be accessed through a co-located cloud computer service, a web service application programming interface (API) or by applications that utilize API, such as cloud desktop storage, a cloud storage gateway or Web-based content management systems. Further, the modeling system 200 may comprise several servers with databases, which may be integrated to be visible to the user as one database and one database server. However, the implementation of the data storage, the manner how data is stored, retrieved and updated, and the location where the model data, engineering drawings and the drawing content data are stored are irrelevant to the invention.

In the following different examples are without describing steps relating to connection establishment(s) to data storages to retrieve or store data.

Figure 3:
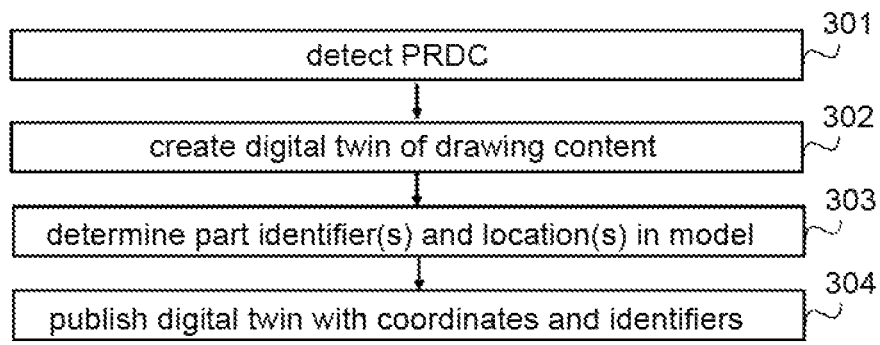
FIGS. 3 to 7 illustrate different examples of functionalities.
Figure 4:
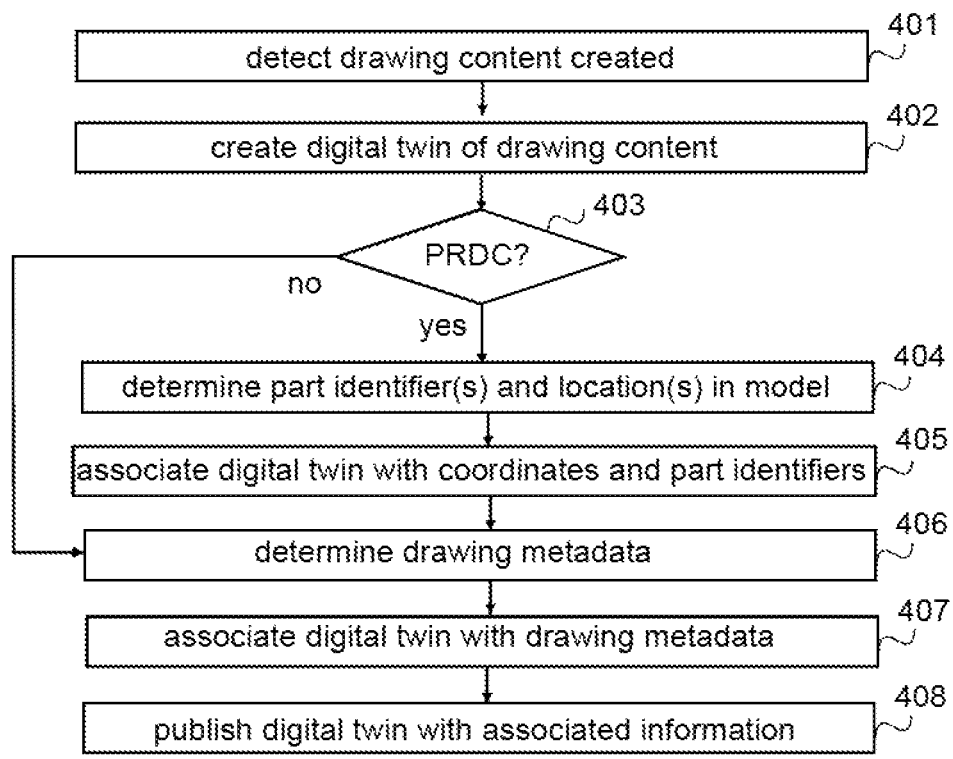
Figure 5:
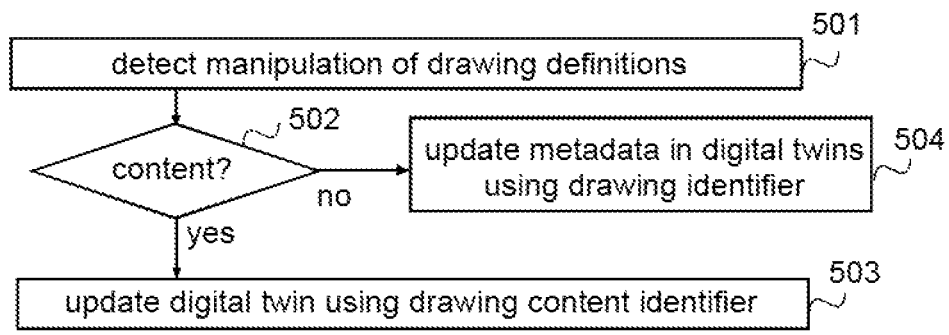

FIGS. 3, 4 and 5 are flow charts illustrating different examples of a functionality of an apparatus, or more precisely the functionality of the drawing content data creation unit. In the illustrated examples it is assumed that the functionality is performed when an engineering drawing is created or manipulated, for example by using a modeling application configured to model structures. Naturally any other type of application, configured to support/use model data may be used.

Referring to FIG. 3, the process starts when a part related drawing content, PRDC, is detected in step 301. If the process is run as a background process when an engineering drawing is created or manipulated, the detection is performed when the PRDC is created to the engineering drawing. If a process is run as a separate operation, i.e. in response to a specific command to create digital twins from an engineering drawing, the drawing definitions are searched for to detect each PRDC in the engineering drawing, and the process of FIG. 3 is performed for each detected PRDC. A PRDC is detected when the drawing content is created, or has been created, by referencing (associating) the drawing content to one or more parts. A digital twin of the drawing content is created in step 302. Further, one or more part identifiers, based on each referenced part, are determined in step 303 and, for each referenced part, its 3D location in the model is determined in step 303. The location may be determined by 3D (x, y, z) coordinates of the reference points of the drawing content in the part, for example. Then the digital twin of the drawing content, the 3D coordinates defining the location and the part identifiers are stored (published) in step 304 to the drawing content data as a separate drawing content object (drawing content instance or drawing content item). Naturally, also other data may be published to be part of the digital twin.

In the illustrated examples of FIGS. 4 and 5 it is assumed that the functionality is performed as a background operation when an engineering drawing is created or manipulated.

Referring to FIG. 4, the process starts when it is detected in step 401 that drawing content is created to the engineering drawing. A digital twin of the drawing content is created in step 402. Then it is checked in step 403, whether or not the drawing content is a PRDC. If it is (step 403: yes), one or more part identifiers, based on each referenced part, are determined in step 404 and for each referenced part, 3D location of each reference point relating to the referenced part in the model is determined in step 404, as described above with step 303 of FIG. 3. When the location(s), and thereby corresponding 3D coordinates have been determined, the 3D coordinates and the part identifiers are associated in step 405 with the digital twin of the drawing content. Then drawing metadata is determined in step 406 and the determined drawing metadata is associated, in step 407, with the digital twin of the drawing content. The metadata may be data of the drawing and/or user defined data. A non-limiting list of examples of the metadata include drawing identifier, drawing type, drawing version (drawing revision), owner of the drawing, creator of the drawing, organization of the drawing, status of the drawing (officially approved, workshop, draft, etc.), one or more tags inputted by a user, one or more user-defined attributes, assembly information, and part information, i.e. information describing what the engineering drawing depicts, such as structure information or object information. (A user defined attribute is an object property created by the user in order to widen the range of predefined object properties. For example, comment, locked, and erection status are user-defined attributes.) Then the digital twin of the drawing content with its associated information is stored in step 408 to the drawing content data as a separate drawing content object (a piece of drawing content data).

If the drawing content is not a PRDC (step 403: no), the process proceeds directly, after creating the digital twin of the drawing content, to step 406 to determine the metadata. It should be appreciated that in some other implementations, coordinates or other location information is determined and associated with the not part related digital twin before the not part related digital twin is published. For example, such a digital twin may be associated with information of a location in a drawing. Using the example of FIG. 1, digital twin 138 may be associated with information "on the upper right corner". Another example is to determine coordinates of the nearest part, or parts, and associate the not part related digital twin with the coordinates, or with the coordinates with an offset. Naturally, any other way to associate a not part related digital twin with some location information may be used.

In an example a manipulation of drawing definitions of an engineering drawing causes updating of corresponding one or more digital twins.

Referring to FIG. 5, if a manipulation of one or more drawing definitions is detected in step 501, it is determined in step 502 whether a drawing content or drawing metadata is manipulated.

If a drawing content is manipulated (step 502: yes), the drawing content identifier is used to update in step 503 the published digital twin to be in accordance with the manipulated drawing content. In other words, a digital twin having the same identifier is searched for and then updated.

If a drawing content is not manipulated (step 502: no), the drawing metadata is manipulated. For example, the status of the engineering drawing may be updated to "officially approved". The metadata in published digital twins of the engineering drawing is updated in step 504 using the drawing identifier. In other words, those digital twins associated with the drawing identifier are searched for, and when found, the metadata associated with a digital twin is updated to be in accordance with the manipulated metadata.

If the manipulating includes deletion of drawing information, it depends on the implementation, whether the corresponding digital twin is also deleted, or maintained with associated information, like "void", to indicate that there is no more a counterpart.

Although the processes in FIGS. 4 and 5 are described as background processes, in which the digital twins are created/updated in real time, corresponding functionality may be performed as a separate operation. For example, a user opens an engineering drawing and selects a function "create drawing content data" (or selects the function and then opens the engineering drawing). Then, instead of detecting that a drawing content is created (step 401) or the drawing definitions being manipulated (step 501), the command to create digital twins is detected, and after that for those drawing contents not yet having a digital twin the process continues as described above with FIG. 4, and for those already having a digital twin the process continues as described above with FIG. 5. In another implementation, digital twins are created only for drawing content created after the process of digital twins has been previously created. In an alternative implementation, digital twins are created each time to all drawing content, even though it may result that a drawing content may have multiple twins. Further, it should be appreciated that the above implementation alternatives may be applied to the process described with FIG. 3, if the digital twins are published with corresponding identifiers.

Figure 6:
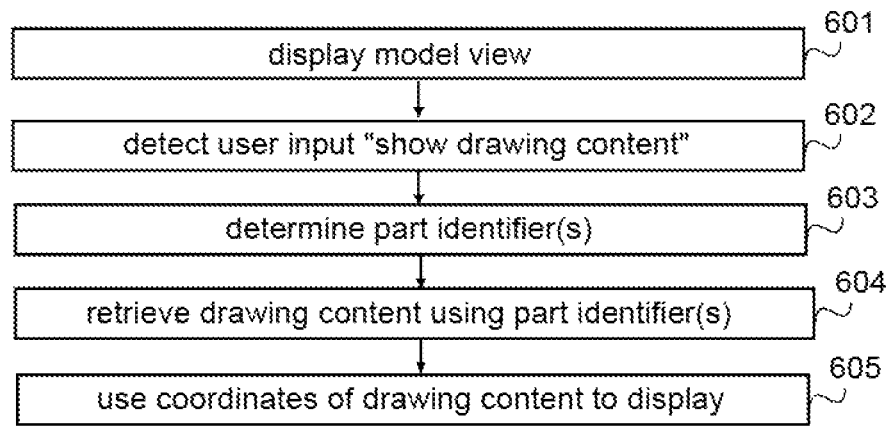
Figure 8A:
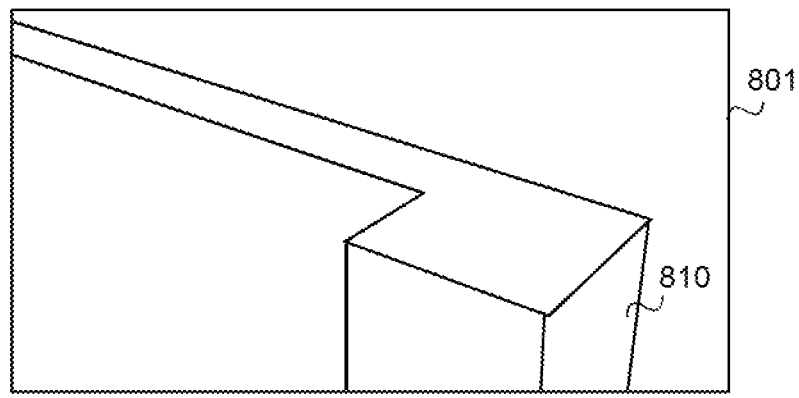
FIGS. 8A, 8B and 8C illustrate use examples.
Figure 8B:
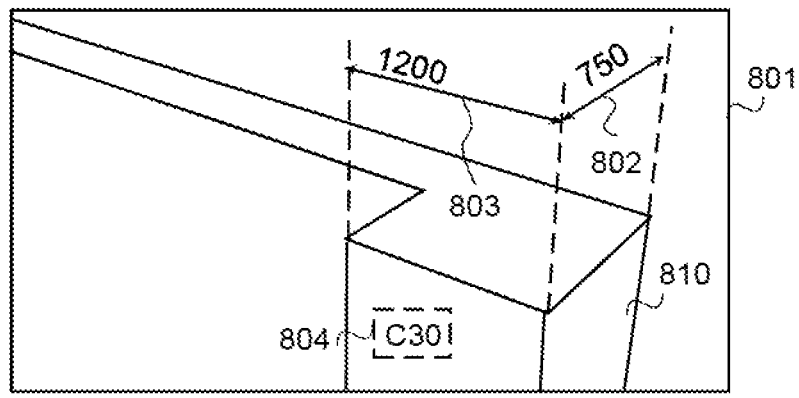

FIG. 6 is a flow chart illustrating an example of a functionality of an apparatus, or more precisely the functionality of the model and drawing content data display unit, together with the example display illustrated in FIGS. 8A and 8B. It illustrate on example how to consume the digital twins on demand. It should be appreciated that the example just illustrate the basic idea and other drawing content than dimensions may be retrieved from the drawing content data to be displayed.

Referring to FIG. 6, the apparatus is running an application in which a 3D model view is displayed in step 601 to a user. The application may be an application of the same type as the one with which the engineering drawings were created, but it may also be a different application, configured to support the drawing content data and model data. Then a user input "show drawing content relating to my selection" is detected in step 602. For example, the user may have selected the column 810 illustrated in FIG. 8A. Depending on an implementation, the user input may cause that the model and drawing content data display unit either starts to run, or change from idle mode to active mode. To show the drawing contents, as indicated by the user input, one or more part identifiers are determined in step 603. The one or more part identifiers are determined based on one or more parts selected by the user before the user input detected in step 602. In one implementation, allowing the command "show drawing content" to be given as user input without any specific selection, the one or more part identifiers are determined based on the parts displayed before the user input detected in step 602, if no prior selection has been made.

The one or more part identifiers are used in step 604 to retrieve those digital twins, i.e. pieces of drawing content data, which comprise at least one of the one or more part identifiers, from the drawing content data. Since the retrieval is based on part identifiers, the retrieved digital twins may originate from more than one engineering drawing. Then, for each piece of drawing content data retrieved, i.e. for each digital twin retrieved, a corresponding drawing content is displayed in step 605 on top of the model, in a display 801 as illustrated in FIG. 8B, using the 3D coordinates in the piece (digital twin) to locate and align the drawing content on top of the view displayed. In the illustrated example of FIG. 8B, the drawing content retrieved is the dimensions 802, 803 with values and dimension lines, and an annotation 804. Depending on the definitions of the dimensions, the values "1200" and "850" may be exact values in the drawing content, or they, or one of them, may be calculated using the information in the model and the reference points in the drawing data, copied to the digital twin. The latter ensure that the dimension values are up-to-date. A further alternative that may be used, is to use drawing content identifier and drawing identifier associated with the digital twin, the drawing identifier to search from engineering drawings the drawing in question, and then the drawing content identifier to find out current definitions of the drawing content, and to use them instead of the drawing content retrieved. That is a useful implementation to ensure up-to-date drawing content, especially if the process in FIG. 5, or a corresponding process, is not implemented and information reflecting up-to-date information in engineering drawings is wanted.

If the process in FIG. 5, or a corresponding process, is implemented in the way that there may be "digital twins" without counterpart in an engineering drawing, they are typically not retrieved in step 604, because they are not any more valid drawing content. However, if a user input indicating "retrieve deleted drawing content" is received, the above process may be implemented but instead of retrieving valid drawing content, drawing content with "void", or corresponding information/indication will be retrieved.

Figure 7:
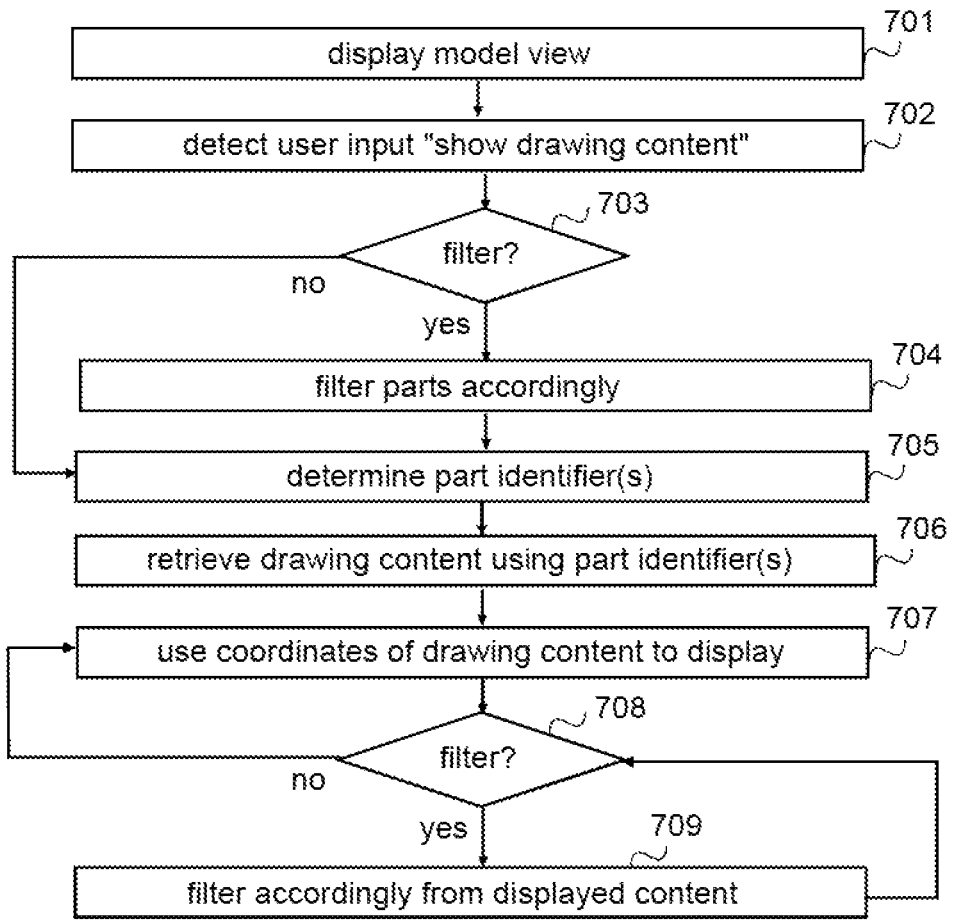

Naturally, more selective selection options what drawing content to display, than the selection of parts used above, may be provided to the user. FIG. 7 illustrates an example of a solution with the more selective selection options.

Referring to FIG. 7, steps 701 and 702 correspond to steps 601 and 602, and are not repeated in vain herein. In the example it is assumed that a user may select, either together with the user input, or just after or before that, one or more types, like columns, beams, slabs, rebars, etc. for which drawing content is to be displayed, or not to be disabled. In other words, a user may select one or more filters but the user may continue without selecting any filter. If the user selects one or more filters (step 703: yes), the selected parts to be displayed are filtered accordingly in step 704 to a subset of the selected parts to be displayed. For example, the user may have selected the column 810 illustrated in FIG. 8A with a filter "no rebars", and the rebars in the column 810 (not illustrated in FIG. 8A) are filtered, leaving the column to be the only selected part after step 704. Then the process continues to step 705 to determine one or more part identifiers, using the selected parts that were not filtered away in step 705. Then using the part identifier(s), drawing content is retrieved in step 706 and displayed in step 707. The steps 705-707 correspond to steps 603-605, and therefore are not described in such a detail herein.

Figure 8C:
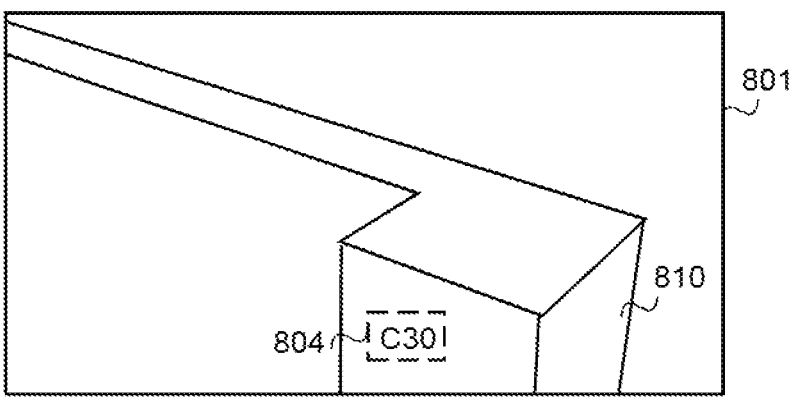

It may be that there is still too much drawing content displayed. Therefore in the illustrated example, the user is provided an opportunity to further filter the drawing content. There are plenty of different possibilities. A non-limiting list of examples include that the user may be provided to select whether to display dimensions, annotations, or both, or only approved drawing content or only drawing content in building permit drawings or only drawing content with specific metadata and/or tag, such as metadata indicating that the drawing is to be used in a building site. If a user input selecting one or more of possibilities to further filter the drawing content displayed is detected (step 708: yes), the displayed drawing content is filtered in step 709 accordingly. For example, if the user input indicates "no dimensions" in the display 801 illustrated in FIG. 8B, the result would be a display 801 illustrated in FIG. 8C.

In the illustrated example, the opportunity to further filter the drawing content is provided as long as the view displayed remains the same.

In another implementation the further filters described with step 708 may be given already in step 703, and the further filters, which are not part-related filters are used in step 706 in addition to the part identifiers, to retrieve the digital twins. In a still further implementation, any possibility to filter is provided only after step 707.

Figure 9:
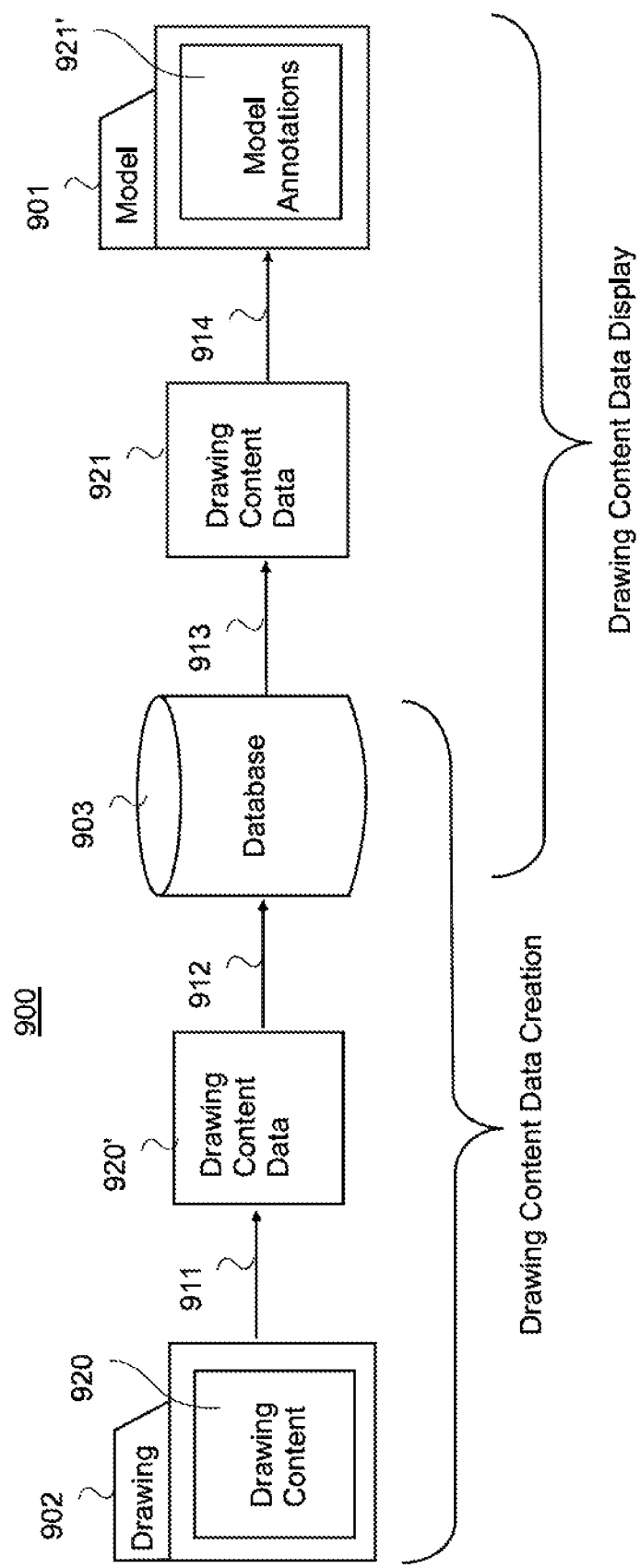
FIG. 9 is another schematic diagram depicting the basic concept.

FIG. 9 is a schematic diagram depicting the basic concept in a form of an information flow in a system 900.

Referring to FIG. 9, the information flow starts when an engineering drawing 902 is created with drawing content 920, as is known in the art. All other parts of the information flow are new parts. The drawing content is extracted (flow 911), automatically or in response to a user input, to be drawing content data 920 (information defining one or more digital twins) which is uploaded (flow 912) to a database 903. A drawing content data creation flow ends therein.

However, use of the drawing content data, i.e. a drawing content data display flow starts from the database 903 when at least some of the drawing content data 921 in the database 903 is downloaded (flow 913). The downloaded drawing content data 921 is used to annotate (flow 914) a model 901 displayed with corresponding model annotations 921'. (It should be appreciated that the term annotations in this example covers all possible additional information described in more detail with FIG. 1.)

Thanks to the separate drawing content data, a designer of a building, or a user in a building site, for example, may obtain clearer and more illustrative, drawing content information on the fly, whilst the original drawings remain intact. That is a very important feature, especially to officially approved engineering drawings of building permits, since they are legal documents. With the clearer, more illustrative drawing contents it is possible to minimize manufacturing and/or maintenance errors, for example. The separate drawing content data may even speed up the manufacturing process, since it may be possible that less time to figure out drawing contents is needed in the site. For example, there is no need to open a drawing definition application (drawing editor application, document editor application) in the user apparatus to view the drawing contents, and no time is spent for the user to search for the proper drawing. As a further effect, energy consumption of the user apparatus on the site is lower when only one application (viewer) is running instead of two (viewer and editor). In addition, the drawing content information is available via a user apparatus not comprising a drawing definition application.

Figure 10:
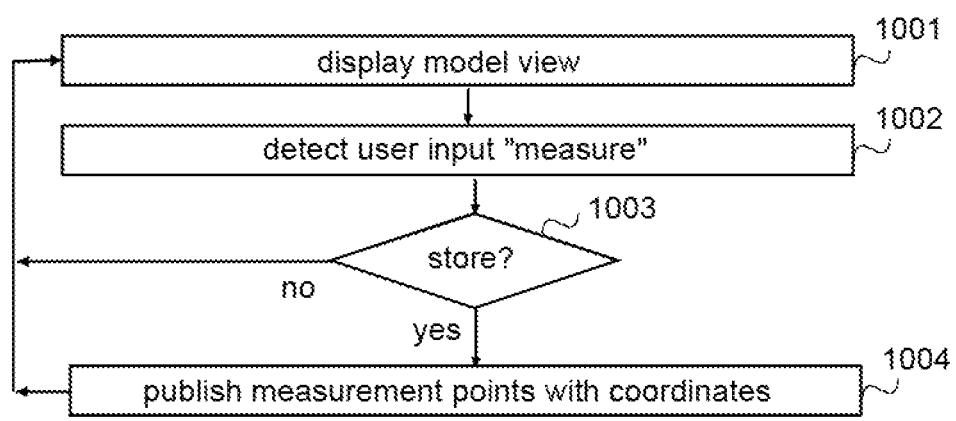
FIG. 10 illustrate a further example of a functionality.

The drawing content data as a separate component provides also a possibility to store measurements created when a model is viewed, for example in a building site. For example, a drawing content data display unit may be configured to provide such a feature. FIG. 10 is a flow chart depicting an example of the feature (functionality). In the example it is assumed that a measurement (dimension) is created by receiving, as a user input, two measurements points (a start point and an end point).

Referring to FIG. 10, when, while a model view is displayed (step 1001), a user input indicating measurement is detected in step 1002, the user is prompted to indicate whether or not the result is to be stored (published). If not (step 1003: no), displaying of the model view is continued (step 1001), with the addition that the result is displayed as well. If the result is to be stored (step 1003: yes), the result is published by publishing in step 1001 measurement points with their respective coordinates in the model to the drawing content data (comprising the digital twins). In addition to the coordinates, also other information and metadata, such as part identifier(s), or status "created from model", or "not drawing information" may be published together with the measurement points.

The steps and related functions described above in FIGS. 3 to 7, 9 and 10 are in no absolute chronological order, and some of the steps may be performed simultaneously or in an order differing from the given one. Other functions can also be executed between the steps or within the steps. For example, the user may be prompted to add metadata to the digital twin before the digital twin is published. Another example is creating from each multi dimension or dimension group drawing content digital twins also for each corresponding single dimension, and sub-group(s) of the multi dimension or dimension group. Some of the steps or part of the steps can also be left out or replaced by a corresponding step or part of the step.

The techniques described herein may be implemented by various means so that an apparatus implementing one or more functions/operations described above with an embodiment/example, for example by means of any of FIGS. 1 to 10 and any combination thereof, comprises not only prior art means, but also means for implementing the one or more functions/operations of a corresponding functionality described with an embodiment, for example by means of any of FIGS. 1 to 10 and any combination thereof, and it may comprise separate means for each separate function/operation, or means may be configured to perform two or more functions/operations. For example, one or more of the means and/or a drawing content data creation unit and/or a drawing content data display unit, or any corresponding unit, for one or more functions/operations described above may be software and/or software-hardware and/or hardware and/or firmware components (recorded indelibly on a medium such as read-only-memory or embodied in hard-wired computer circuitry) or combinations thereof. Software codes may be stored in any suitable, processor/computer-readable data storage medium(s) or memory unit(s) or article(s) of manufacture and executed by one or more processors/computers, hardware (one or more apparatuses), firmware (one or more apparatuses), software (one or more modules), or combinations thereof. For a firmware or software, implementation can be through modules (e.g., procedures, functions, and so on) that perform the functions described herein.

Figure 11:
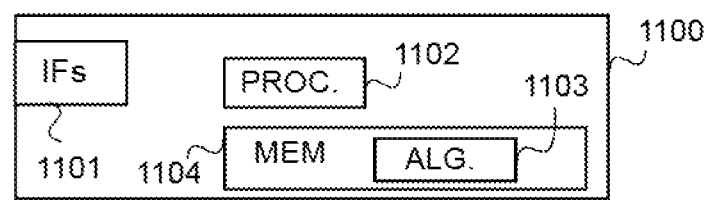
FIG. 11 is a schematic block diagram of an example of an apparatus.

FIG. 11 is a simplified block diagram illustrating some units for an apparatus 1100 comprising the drawing content data creation unit and/or the drawing content data display unit, or any corresponding unit or sub-units, or configured otherwise to perform at least some functionality described above, for example by means of any of FIGS. 1 to 10 and any combination thereof, or some of the functionalities if functionalities are distributed in the future. In the illustrated example, the apparatus comprises one or more interface (IF) entities 1101, such as one or more user interfaces, one or more processing entities 1102 connected to various interface entities 1101 and to one or more memories 1104.

The one or more interface entities 1101 are entities for receiving and transmitting information, such as communication interfaces comprising hardware and/or software for realizing communication connectivity according to one or more communication protocols, or for realizing data storing and fetching, or for providing user interaction via one or more user interfaces. The one or more user interfaces may be any kind of a user interface, for example a screen, a keypad, or an integrated display device or external display device.

A processing entity 1102 is capable to perform calculations and configured to implement at least the drawing content data creation unit and/or the drawing content data display unit, described herein, or at least part of functionalities/operations described above, for example by means of any of FIGS. 1 to 10 and any combination thereof, as a corresponding unit or a sub-unit if distributed scenario is implemented, with corresponding algorithms 1103 stored in the memory 1104. The entity 1102 may include a processor, controller, control unit, micro-controller, unit, module, etc. suitable for carrying out embodiments or operations described above, for example by means of any of FIGS. 1 to 10 and any combination thereof. Generally the processor is a central processing unit, but the processor may be an additional operation processor.

A memory 1104 is usable for storing a computer program code required for the drawing content data creation unit and/or for the drawing content data display unit, or for any corresponding unit or sub-units, or for one or more functionalities/operations described above, for example by means of any of FIGS. 1 to 10 and any combination thereof, i.e. the algorithms for implementing the functionality/operations described above by means of any of FIGS. 1 to 10 and any combination thereof. The memory 1104 may also be usable for storing other possible information, like the engineering drawings and temporarily stored information.

As a summary, each or some or one of the units/sub-units and/or algorithms for functions/operations described herein, for example by means of means of any of FIGS. 1 to 10 and any combination thereof, may be configured as a computer or a processor, or a microprocessor, such as a single-chip computer element, or as a chipset, or one or more logic gates including at least a memory for providing storage area used for arithmetic operation and an operation processor for executing the arithmetic operation. Each or some or one of the units/sub-units and/or algorithms for functions/operations described above, for example by means of means of any of FIGS. 1 to 10 and any combination thereof, may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed and/or will be programmed by downloading computer program code (one or more algorithms) in such a way to carry out one or more functions of one or more embodiments/examples.

An embodiment provides a computer program embodied on any client-readable distribution/data storage medium or memory unit(s) or article(s) of manufacture, comprising program instructions executable by one or more processors/computers, which instructions, when loaded into an apparatus, constitute the drawing content data creation unit and/or the drawing content data display unit, or an entity providing corresponding functionality, or at least part of the corresponding functionality. Programs, also called program products, including software routines, program snippets constituting "program libraries", applets and macros, can be stored in any medium and may be downloaded into an apparatus. In other words, each or some or one of the units/sub-units and/or the algorithms for one or more functions/operations described above, for example by means of means of any of FIGS. 1 to 10 and any combination thereof, may be an element that comprises one or more arithmetic logic units, a number of special registers and control circuits.

It will be obvious to a person skilled in the art that, as the technology advances, the inventive concept can be implemented in various ways. The invention and its embodiments are not limited to the examples described above but may vary within the scope of the claims.

What is claimed is:

1. A computer implemented method comprising:
running in a computing device an application for creating or manipulating engineering drawings that are created from model data of a model and stored to drawing data of the model, which model data comprises a plurality of parts to model one or more structures, the model being displayable in a three-dimensional model view that is different from engineering drawings;

detecting, by the computing device, in an engineering drawing, drawing content, which relates to at least one of the plurality of parts, is additional information to the model data, and stored to the drawing data;

creating, by the computing device, in response to the detecting, a digital twin of the drawing content, wherein the digital twin is a separate piece that is not in the engineering drawing but has its counterpart drawing content in the engineering drawing;

determining, by the computing device, at least identifying information of the at least one of the plurality of parts, and location information of the at least one of the plurality of parts in a global three-dimensional coordinate system of the model to determine three-dimensional coordinates for the counterpart drawing content; and publishing the digital twin of the drawing content with the three-dimensional coordinates and the identifying information of the at least one of the plurality of parts without changing the counterpart drawing content in the engineering drawing.

2. The computer implemented method of claim 1, further comprising performing the detecting in response to a user input creating to the engineering drawing the drawing content.

3. The computer implemented method of claim 1, further comprising:

determining, by the computing device, drawing metadata comprising one or a plurality of a drawing identifier, a drawing type, a drawing version, an owner of the drawing, a creator of the drawing, an organization of the drawing, a status of the drawing, assembly information, structure information, one or more tags inputted by a user and one or more user-defined attributes; and publishing the digital twin also with the drawing metadata.

4. The computer implemented method of claim 3, further comprising:

detecting, by the computing device, in the engineering drawing, a drawing content of a second type, which does not relate to any of the plurality of parts;

creating, by the computing device, in response to the detecting, a digital twin of the drawing content of the second type;

publishing, by the computing device, the digital twin of the drawing content of the second type with the drawing metadata.

5. The computer implemented method of claim 4, further comprising performing the detecting in response to a user input creating, to the engineering drawing, the drawing content of the second type.

6. The computer implemented method of claim 1, wherein the drawing content, which relates to at least one of the plurality of parts, comprises a dimension or an annotation.

7. The computer implemented method of claim 1, wherein the model is a model for a building and the engineering drawing is a technical drawing required for a building permit to build the building.

8. A computer implemented method comprising:

running in a computing device an application for at least displaying, using model data, a three-dimensional view of a model, which comprises one or more parts to model one or more structures;

detecting a user input requesting drawing content data relating to at least one of the one or more parts, wherein the at least one part includes either one or more parts selected by a user or, when no specific selection has been received as a user input, one or more parts that are in the displayed three-dimensional view of the model;

determining identifying information of the at least one of the one or more parts;

retrieving, using the identifying information, from a data repository, which comprises a plurality of digital twins of drawing contents created from counterpart drawing contents in engineering drawings defined to the model from the model data of the model and stored to drawing data of the model, one or more digital twins of the plurality of digital twins of requested one or more drawing contents with their three-dimensional coordinate information, wherein each engineering drawing is different from the three-dimensional view of the model, each of the one or more drawing contents, which is stored to the drawing data, is additional information to the model data, and each digital twin is a separate piece, that is not in the engineering drawing but has its counterpart drawing content in the engineering drawing; and displaying the one or more digital twins of the drawing contents on top of the model by placing each drawing content in the one or more digital twins on top of the displayed model view using corresponding three-dimensional coordinate information.

9. A computer implemented method as claimed in claim 8, wherein the drawing content, which relates to at least one of the one or more parts, comprises a dimension or an annotation.

10. A computer implemented method as claimed in claim 8, wherein the model is a model for a building and the engineering drawing is a technical drawing required for a building permit to build the building.

11. A non-transitory computer readable medium comprising program instructions for causing, when executed by a computing device, which runs an application for creating or manipulating engineering drawings that are created from model data of a model and stored to drawing data of the model, which model data comprises a plurality of parts to model one or more structures, the model being displayable in a three-dimensional model view that is different from engineering drawings, the computing device to perform:

detecting, in an engineering drawing, drawing content, which relates to at least one of the plurality of parts, is additional information to the model data and stored to the drawing data;

creating, in response to the detecting, a digital twin of the drawing content, wherein the digital twin is a separate piece that is not in the engineering drawing but has its counterpart drawing content in the engineering drawing;

determining at least identifying information of the at least one of the plurality of parts, and location information of the at least one of the plurality of parts in a global three-dimensional coordinate system of the model to determine three-dimensional coordinates for the counterpart drawing content; and publishing the digital twin of the drawing content with the three-dimensional coordinates and the identifying information of the at least one of the plurality of parts without changing the counterpart drawing content in the engineering drawing.

12. The non-transitory computer readable medium of claim 11, wherein the program instructions further causes, when executed by the computing device, the computing device to perform the detecting in response to a user input creating to the engineering drawing the drawing content.

13. The non-transitory computer readable medium of claim 11, wherein the program instructions further causes, when executed by the computing device, the computing device to perform:
    determining drawing metadata comprising one or a plurality of a drawing identifier, a drawing type, a drawing version, an owner of the drawing, a creator of the drawing, an organization of the drawing, a status of the drawing, assembly information, structure information, one or more tags inputted by a user and one or more user-defined attributes; and
    publishing the digital twin also with the drawing metadata.

14. The non-transitory computer readable medium of claim 13, wherein the program instructions further causes, when executed by the computing device, the computing device to perform:
    detecting in the engineering drawing, a drawing content of a second type, which does not relate to any of the plurality of parts;
    creating, in response to the detecting, a digital twin of the drawing content of the second type;
    publishing the digital twin of the drawing content of the second type with the drawing metadata.

15. The non-transitory computer readable medium of claim 14, wherein the program instructions further causes, when executed by the computing device, the computing device to perform the detecting in response to a user input creating, to the engineering drawing, the drawing content of the second type.

16. The non-transitory computer readable medium of claim 11, wherein the drawing content, which relates to at least one of the plurality of parts, comprises a dimension or an annotation.

17. An apparatus comprising at least one processor; and at least one memory including computer program code;
    the at least one memory and the computer program code being configured to, with the at least one processor, cause the apparatus at least to:
    run an application for at least displaying, using model data, a three-dimensional view of a model, which comprises one or more parts to model one or more structures;
    detect a user input requesting drawing content data relating to at least one of the one or more parts, wherein the at least one part includes either one or more parts selected by a user or, when no specific selection has been received as a user input, one or more parts that are in the displayed three-dimensional view of the model;
    determine identifying information of the at least one of the one or more parts;
    retrieve, using the identifying information, from a data repository, which comprises digital twins of drawing contents created from counterpart drawing contents in engineering drawings defined to the model from the model data of the model and stored to drawing data of the model, one or more digital twins of the plurality of digital twins of requested one or more drawing contents with their three-dimensional coordinate information, wherein each engineering drawing is different from the three-dimensional view of the model, each of the one or more drawing contents, which is stored to the drawing data, is additional information to the model data, and each digital twin is a separate piece, that is not in the engineering drawing but has its counterpart drawing content in the engineering drawing; and
    display the one or more digital twins of the drawing contents on top of the model by placing each drawing content in the one or more digital twins on top of the displayed model view using corresponding three-dimensional coordinate information.

18. The apparatus of claim 17, wherein the drawing content, which relates to at least one of the one or more parts, comprises a dimension or an annotation.

19. A system comprising at least:
    one or more data storages for storing model data comprising one or more three-dimensional parts to model one or more structures, for storing drawing data comprising two-dimensional engineering drawings created using the model data, one or more of the engineering drawings comprising one or more drawing contents defined to the engineering drawings, wherein each of the one or more drawing contents, which is stored to the drawing data, is additional information to the model data, and for storing drawing content data comprising at least digital twins of drawing contents, the digital twins being associated at least with their three-dimensional coordinate information and identifying information, which identifies one or more parts in the model data, wherein each digital twin of a drawing content is a separate piece, that is not in an engineering drawing but has its counterpart drawing content in the engineering drawing;
    one or more first apparatuses configured to perform:
    running an application for creating and/or manipulating engineering drawings that are created from model data of a model and stored to drawing data of the model, the model being displayable in a three-dimensional model view that is different from engineering drawings;
    detecting, in an engineering drawing, drawing content, which relates to at least one of plurality of parts of the model;
    creating, in response to the detecting the drawing content, a digital twin of the drawing content;
    determining at least identifying information of the at least one of the plurality of the parts of the model, and location information of the at least one of the plurality of parts of the model in a global three-dimensional coordinate system of the model to determine three-dimensional coordinates for the digital twin;
    publishing the digital twin with the three-dimensional coordinates and the identifying information of the at least one of the plurality of the parts of the model without changing the drawing content in the engineering drawing; and
    one or more second apparatuses configured to perform:
    running an application for at least displaying, using the model data, a three-dimensional view of the model;
    detecting a user input requesting drawing content data relating to at least one part of the plurality of the parts of the model, wherein the at least one part includes either one or more parts selected by a user or, when no specific selection has been received as a user input, one or more parts that are in the displayed three-dimensional view of the model;
    determining identifying information of the at least one part;
    retrieving, using the identifying information, from the data repository, one or more digital twins of requested one or more drawing contents with their three-dimensional coordinate information;

displaying the one or more digital twins of the drawing contents on top of the model by placing each drawing content in the one or more digital twins on top of the displayed model view using corresponding three-dimensional coordinate information.

20. The system of claim 19, wherein at least the one or more data storages for storing drawing content data are cloud-based storages in a cloud environment whereto the digital twins with associated information are published.

* * * * *